United States Patent [19]

Goss et al.

[11] Patent Number: 4,911,046
[45] Date of Patent: Mar. 27, 1990

[54] HYBRID LEAD TRIM DIE

[75] Inventors: Steven R. Goss; Eric M. Frey, both of Tucson, Ariz.

[73] Assignee: Hughes Aircraft Company, Los Angeles, Calif.

[21] Appl. No.: 324,775

[22] Filed: Mar. 16, 1989

[51] Int. Cl.⁴ .......... B23P 23/00; B26D 1/00; B26D 5/08
[52] U.S. Cl. .......... 83/198; 29/566.3; 29/741; 83/465; 83/580; 269/903
[58] Field of Search .......... 83/196, 198, 451, 580, 83/925 R, 926 B, 200, 942; 269/903; 29/566.3, 741; 140/105

[56] References Cited

U.S. PATENT DOCUMENTS

| 3,798,734 | 3/1974 | Fedor | 29/203 B |
|---|---|---|---|
| 4,187,751 | 2/1980 | Barnacle | 83/458 |
| 4,548,111 | 10/1985 | Tarbuck | 83/196 |
| 4,597,179 | 7/1986 | Goforth | 30/233 |
| 4,602,661 | 7/1986 | Heller et al. | 140/105 |

Primary Examiner—Frank T. Yost
Assistant Examiner—Kenneth E. Peterson
Attorney, Agent, or Firm—R. M. Heald; M. W. Sales; W. K. Denson-Low

[57] ABSTRACT

A multiple die is used to trim a plurality of electrical component leads, all at the same time, by using a die and a hydraulic press to develop a shearing action. Male and female die members each define a pattern of holes arrayed to mate with the configuration of leads extending from an electronic package. Near the upper face of the female die member, a plurality of tiny O-rings are mounted, one for each lead, encircling the paths for the leads as the package is positioned atop the die. The transverse relative motion between the male and female members of the die shears the leads while the O-rings serve to isolate and limit the amount of shock and vibration that can be transmitted along the leads.

23 Claims, 3 Drawing Sheets

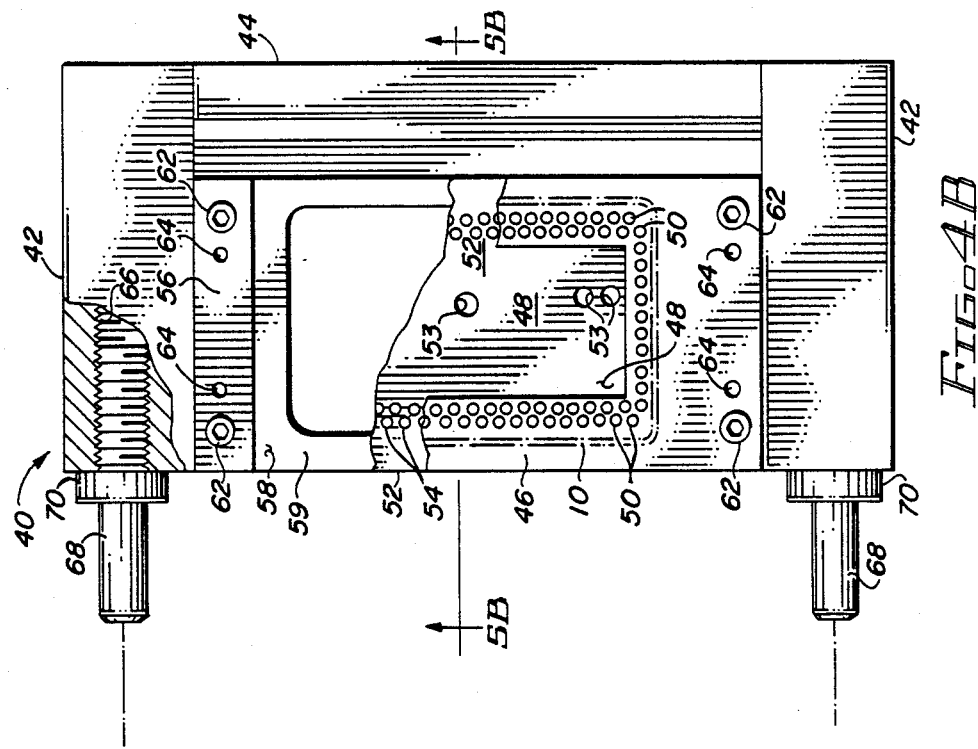

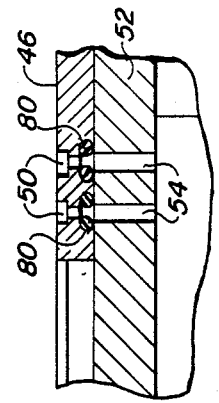
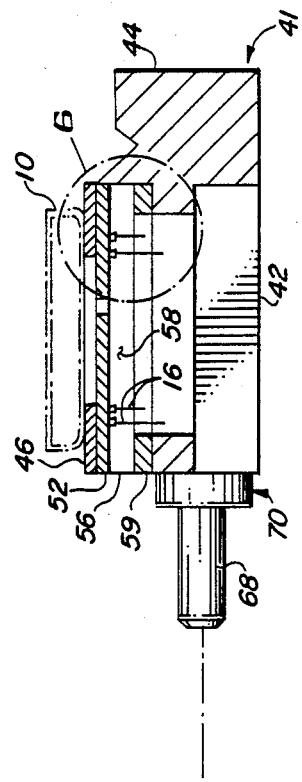
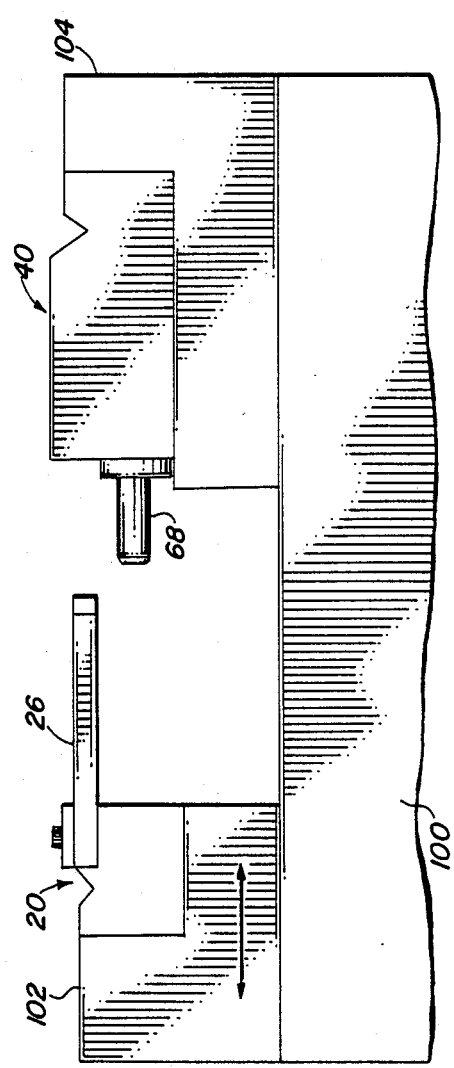
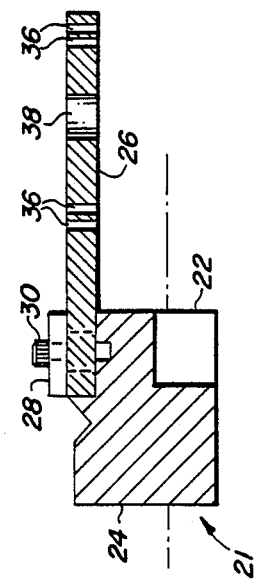

HYBRID LEAD TRIM DIE

BACKGROUND OF THE INVENTION

1. Field of the Invention

This invention relates to apparatus for trimming electrical component leads and, more particularly, to such apparatus for gang trimming the plurality of leads which extend from hermetically sealed, hybrid electronic packages.

2. Description of the Related Art

In the fabrication of electronic circuitry utilizing individual circuit components mounted on printed circuit boards and the like, it is customary to clip the leads after assembly in order to remove the excess lengths. The act of clipping a lead with a standard wire cutter or similar device generally imparts significant shock along the lead which may damage delicate electronic components to which the lead is attached. It has long been customary to use some way of clamping such leads inboard from the clipping point to try to minimize the shock that is transmitted to the component end of the lead.

In electronic packages where the components are enclosed within hermetically sealed housings, it is essential that the glass-to-metal seal not be damaged during the clipping of the exterior leads. In the past, rather elaborate (if somewhat crude) procedures have been followed in order to control the extent of the shock from the clipping operation which reaches the hermetic seal. For example, one approach to this problem called for the hybrid electronic packages to be mounted in a circuit board with the leads being flow soldered in place. The leads were then clipped one at a time by hand with the solder joint acting to isolate the glass bead which defines the hermetic seal from shock. The arrangement was then flow soldered again to cover the base lead material which was exposed by the clipping. This hand-clipping operation was a time-consuming process and the solder re-flow operation essentially doubled the cost of flow soldering for each board. In addition, certain product markets do not admit of solder re-flow operations because of the possible deleterious effects engendered by more than one soldering operation.

SUMMARY OF THE INVENTION

In brief, arrangements in accordance with the present invention involve the use of a particular trimming die in conjunction with a mounting jig installed for operation by a hydraulic press. All of the leads of a given hermetically sealed, hybrid electronic package are sheared at once to predetermined lead lengths. The mounting jig serves to position tiny O-rings on each of the leads close to the hermetic seal point. The selection of die clearances, materials and shear angle minimizes lead damage, and the use of the O-rings serves to isolate the glass beads from the shock and vibration associated with the shearing action.

One particular arrangement in accordance with the invention comprises male and female die members constructed to develop a shearing action of a plurality of leads extending through the die members when the two members are transversely moved relative to each other. The extent of the movement need be no more than 1/16 inch in order to develop the multiple shearing action.

Each of the male and female members has a plurality of holes therein which are arrayed in a pattern to match the pattern of the leads being trimmed. The female member is mounted on a stationary frame portion of a hydraulic press. The male die member is affixed to the movable element of the press. The male member has a blade portion which is configured to fit closely within a mating pocket or recess portion of the female member. The dimensions of the die members are such, relative to the lengths of the leads being trimmed, that when the electronic package is in place with its leads extending into the die, they project through the upper wall of the female member and only partially into the blade of the male member. It is these terminal or distal portions of the leads which extend into the blade that are removed during the trimming step. The length of final trim is established by the dimensions of the female member.

After mounting of the electronic package in place on the die, the hydraulic press is actuated to move the blade member toward the female member by an amount, approximately two to three lead diameters, sufficient to shear the leads at the point where they enter the blade portion. The positioning of the tiny O-rings on the leads is effected at the base of the leads near where they enter the glass bead seals in the wall of the electronic package. These O-rings are affixed in the female die member in positions surrounding the respective apertures through which the leads are inserted in preparation for trimming.

BRIEF DESCRIPTION OF THE DRAWING

In the accompanying drawings:

FIGS. 4A and 4B are plan views, partially broken away, of respective male and female die assemblies showing one particular arrangement of the present invention;

FIGS. 5A and 5B are side elevational views, in section, of the male and female die assemblies of FIGS. 4A and 4B, respectively taken along the lines 5—5 of those figures;

FIG. 6 is an enlarged sectional view of a portion of FIG. 5B; and

FIG. 7 is a schematic block diagram representing the respective die assemblies mounted for use in a hydraulic press.

DESCRIPTION OF THE PREFERRED EMBODIMENT

Figure 1:
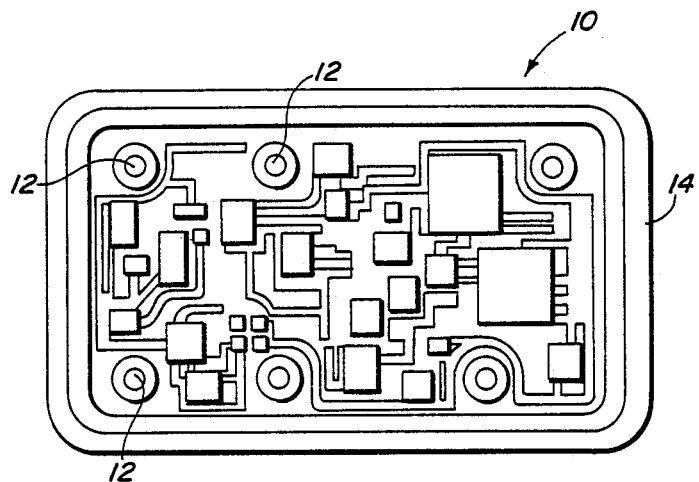
FIG. 1 is a plan view of a typical hermetically sealed, electronic package to which the use of the present invention is directed.
Figure 2:
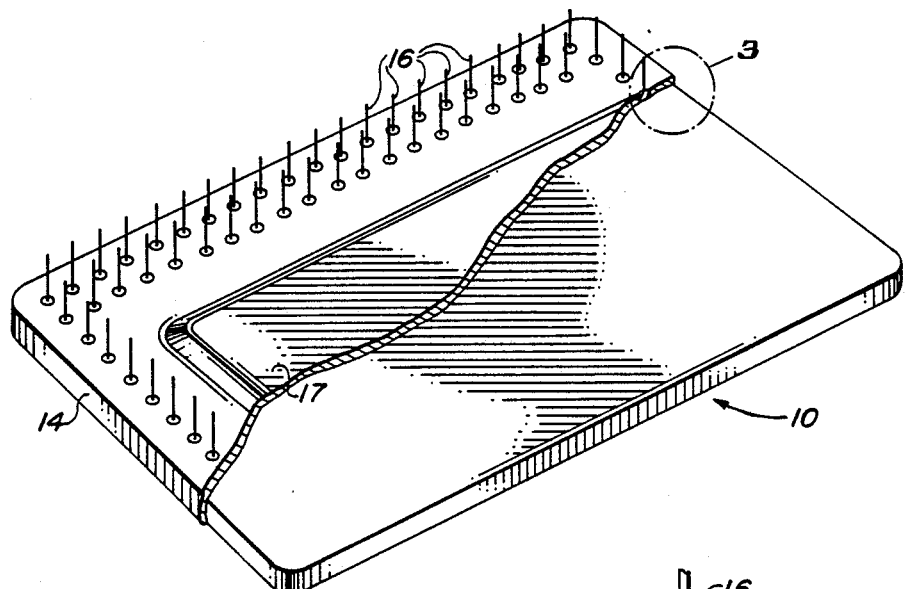
FIG. 2 is a schematic view, partially broken away, of the underside of a package like that of FIG. 1.
Figure 3:
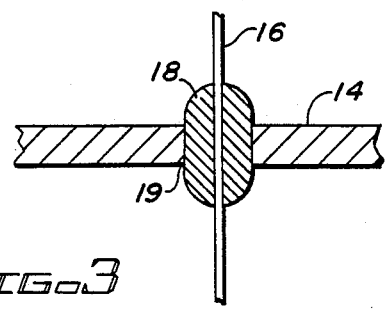
FIG. 3 is an enlarged sectional view of a portion of FIG. 2.

FIGS. 1–3 are presented to show certain details of construction of a typical hermetically sealed, electronic package 10 with which the present invention is associated during one of the final fabrication stages thereof. A typical device 10 is shown in FIG. 1 in plan view with the cover removed so that the various individual components 12 are visible, installed on a miniature circuit board mounted within a dish-shaped metal header 14. The underside of the package 10 is schematically represented in FIG. 2, which shows a plurality of leads 16 protruding from the underside of the package. A generally rectangular spacer or standoff 17, formed in stamping the header 14, projects downwardly in the center of the header, surrounded by the array of leads 16. An hermetic glass-to-metal seal is provided at each point where a lead 16 extends through a hole in the metal header 14. Such a seal is represented schematically in the enlarged view of FIG. 3, showing a glass bead 18 surrounding the lead 16 where it passes through a hole 19 in the metal plate 14.

When the entire package 10 is completed and sealed with its cover in place, it is essential that the integrity of the hermetic seals be preserved to the end of the period of ultimate utilization of the package. After the hermetic sealing step, it is necessary to trim the ends of the leads 16 so that the packages may be inserted in a circuit board and flow soldered without projection of the leads beyond the desired termination points.

The arrangement in accordance with the present invention as depicted in FIGS. 4A–6 provides an improved means for accomplishing the task of trimming the leads 16 without subjecting the hermetic seal structures to the shocks and possible damage which were encountered during trimming of the leads by the previously employed clipping methods.

FIGS. 4A–5B show a male die assembly 20 and a female die assembly 40 oriented as they are placed for use in preparation for trimming the leads of an electronic package 10. The male die assembly 20 is shown comprising a base 21 having opposite sides 22 and a central portion 24. A shearing blade 26 is mounted to the central portion 24 by a retainer bar 28 and a pair of cap screws 30.

The female die assembly 40 also comprises a base 41 having a pair of opposite sides 42 integral with an end 44, to which the remaining parts of the assembly are mounted. An outer or top plate 46 of the female die assembly 40 has a central rectangular aperture 48 (for receiving the spacer 17—see FIG. 2) about which are arrayed a number of holes 50 corresponding to the pins 16 of the electronic package 10. The apertured plate 46 is arranged in a sandwich configuration, best shown in FIG. 5B, on top of a solid plate 52 which has a set of holes 54 corresponding to the holes 50 and equal in number to the leads 16. The solid plate 52 serves as a shear plate for the terminal ends of the leads 16. The plate 52 rests on a pair of spacer bars 56 positioned near the respective sides of the assembly 40 so that a female die opening 58 is established. The spacer bars 56 rest on a bottom plate 59 having a generally rectangular central opening which extends outside the positions of the lead holes 50, 54. This bottom plate 59 in turn rests on the base 41, also defining a generally rectangular central opening which extends outside the positions of the lead holes 50, 54. The openings of the bottom plate 59 and base 41 provide clearance for the leads 16, allowing the trimmed ends to drop out of the die assembly after the shearing step.

The assembly of plates 46, 52, 59 and the spacer bars 56 are mounted to the base 41 by means of mounting screws 62 which extend from the top through the respective plate members and are threaded into the base 41. Pins or dowels 64 are positioned in appropriate holes through the respective members of the assembly for alignment purposes. The base 41 is provided with bores 66 into which are pressed alignment pins 68; collar members 70 act as die stops.

The male die assembly 20 is drilled with bores 32 into which liner bushings 34 are mounted so as to receive the corresponding alignment pins 68 of the female assembly 40 when the two die assemblies 20 and 40 are moved together into engagement with the shearing blade 26 extending into the space 58. The blade 26 is provided with a plurality of holes 36 arrayed to match the holes 50, 54 of the female die assembly 40 when the die assemblies are in mating engagement. The blade 26 is also provided with a number of elongated openings 38 which line up with apertures 53 in the shear plate 52. These openings 53 and 38 are situated to accommodate certain portions of the electronic package 10 which may project downwardly beyond the plane of the bottom surface of the package, including the spacer.

As shown in FIGS. 4B and 5B, a device 10 is represented in phantom outline by the broken lines which are provided to indicate the relative position of the device 10 when it is mounted on the female assembly 40. The holes 50, 54 of the plates 46, 52 are shown filled with the leads 16, whereas the holes 36 of the blade member 26 are shown as openings without the leads positioned therein. When the two die assemblies 20, 40 are moved together in mating engagement with the alignment pins 68 entered in the bushings 34, the holes 36 of the shearing blade 26 are aligned with the holes 50, 54 of the plates 46, 52 of the female die assembly 40 in preparation for trimming the leads 16. This engaged and aligned position is established before the device 10 is placed in position on top of the die assembly 40 with its leads 16 extending through the respective holes 50, 54 and into the holes 36.

FIG. 6 shows an enlarged section of a portion of the female die assembly 40, particularly illustrating a pair of holes 50 of the outer plate 46 oriented above corresponding holes 54 of the shear plate 52. It will be noted that each of the holes 50 is countersunk on the upper side and counterbored on the lower side of the outer plate 46 and that a tiny O-ring 80 is mounted in each of the counterbores surrounding the holes 50. The O-rings 80 are fabricated of a resilient material with an inside diameter which is slightly less than the outer diameter of the leads 16 of the package 10 so that when the leads 16 are inserted through the holes 50 and O-rings 80, the O-rings stretch somewhat and tend to grip the leads 16 in position.

The block diagram of FIG. 7 indicates a hydraulic press 100 having a fixed bed member 104 on which the female die assembly 40 is mounted and a movable bed member 102 on which the male die assembly 20 is mounted. In operation, the blocks 102, 104 are moved together so that the shearing blade 26 is in position within the assembly 40. An electronic package 10 is then placed on top of the assembly 40 with its leads 16 inserted into the corresponding holes and O-rings as described above in connection with FIGS. 4A–6. The blocks 102, 104 are then moved slightly together by the hydraulic press 100. A movement of approximately three lead diameters is sufficient to shear the terminal ends of the leads with the leads 16 all being left at the desired length for insertion into a circuit board in final manufacture. A shear angle of 0 degrees is developed in this embodiment of the invention in order to minimize the shock which is transmitted axially or longitudinally along the lead. The O-rings serve to cushion the glass beads forming the hermetic seals from the shock imparted to the leads by the shearing process (which is substantially reduced in magnitude as compared with the shock imparted to a lead by manual clipping). Thus, the hermetic seals established by the glass beads are effectively protected against damage. Tests of finished parts produced through the use of arrangements in accordance with the present invention have shown that this method is extremely effective in protecting the glass bead hermetic seals against damage.

The shear plate 52 establishes the final trim dimension of the leads 16, since the spacer 17 rests on the shear plate 52 and the leads are trimmed flush with the lower surface of the shear plate 52.

In a typical arrangement, the holes 50, 54 (106 in number) were formed with a diameter of 0.028 inch, thus closely fitting the leads 16 which are about 0.020 inch in diameter and oftentimes somewhat rough or uneven along their exterior surface. The O-ring recesses on the underside of the holes 50 were 0.056 inch in diameter and 0.020 inch deep. The O-rings 80 had an inner diameter of 0.016 inch and were 0.020 inch thick. The holes 36 in the shearing blade 26 were 0.062 inch in diameter, being sufficiently larger than the leads to permit the trimmed ends to drop free of the shearing blade. The spacer bars 56 were 0.087 inch thick, as was the blade 26, thus establishing a slip fit of the shearing blade 26 against the shear plate 52 within the space 58 for best results in shearing the ends of the leads 16.

Although there have been shown and described hereinabove specific arrangements of a hybrid lead trim die in accordance with the invention for the purpose of illustrating the manner in which the invention may be used to advantage, it will be appreciated that the invention is not limited thereto. Accordingly, any and all modifications, variations, or equivalent arrangements which may occur to those skilled in the art should be considered to be within the scope of the invention as defined in the annexed claims.

What is claimed is:

1. Apparatus for trimming electrical circuit leads comprising:
    a female die assembly including a shear plate having a first plurality of holes therethrough for receiving a plurality of circuit leads extending from an electronic circuit package;
    a male die assembly including a shearing blade having a second plurality of holes therethrough for receiving said leads when the shearing blade is in position alongside said shear plate with said first and second pluralities of holes in corresponding alignment;
    means for maintaining the shearing blade in sliding contact with the shear plate during relative movement between them;
    means for establishing relative movement between said blade and said plate to shear the circuit leads inserted in said holes and
    shock absorbing means competed on said female die assembly encircling and gripping said leads for reducing the transmission of shock waves along said leads caused by trimming the leads.

2. The apparatus of claim 1 wherein said shock of spring means comprises resilient damping means installed adjacent the shear plate at each one of the holes therein.

3. The apparatus of claim 2 further including an outer plate positioned along the side of the shear plate remote from the shear blade and having means for retaining said damping means in position adjacent the shear plate.

4. The apparatus of claim 3 wherein said outer plate includes means defining a third plurality of holes therethrough in alignment with corresponding holes of said first plurality, each of said third plurality of holes being countersunk remote from said shear plate and having a counterbore adjacent said shear plate, said counterbore being adapted to receive resilient damping means therein.

5. The apparatus of claim 4 wherein said resilient damping means comprise an O-ring of resilient material mounted in each of said counterbores and bearing against said shear plate.

6. The apparatus of claim 5 wherein said O-rings are selected to have an inner diameter which is slightly less than the outer diameter of the circuit leads to be sheared by the apparatus.

7. The apparatus of claim 4 wherein the outer plate further defines a central opening for receiving a spacer portion of an electronic circuit package having leads to be trimmed and wherein the shear plate includes a portion overlapping said central opening for supporting said package by contacting said spacer portion.

8. The apparatus of claim 7 wherein the thickness of the shear plate determines the final trimmed length of the leads.

9. The apparatus of claim 1 wherein said maintaining means comprise a bottom plate which is aligned parallel to said shear plate and spaced therefrom by a dimension which is equal to the thickness of the shearing blade.

10. The apparatus of claim 9 wherein said spacer means comprise a pair of spacing bars positioned on opposite sides of the female die assembly between the shear plate and the bottom plate to define a pocket for receiving said shearing blade in a slip fit within said pocket between said shearing blade and said bottom blade.

11. The apparatus of claim 10 further including means for mounting said plates and said spacer bars in fixed juxtaposition on a rigid base member.

12. The apparatus of claim 11 wherein said bottom plate and said base member each include means defining a central aperture extending beyond the positions of the pluralities of holes in order to permit the sheared ends of the trimmed leads to drop out of the female die assembly.

13. The apparatus of claim 4 wherein said second plurality of holes are larger in diameter than said first and third pluralities of holes by an amount sufficient to permit the sheared ends of the trimmed leads to drop through the shearing blade after being severed.

14. The apparatus of claim 11 wherein said mounting means comprise a plurality of mounting screws extending through holes at opposite sides of the female die assembly through said plates and spacing bars and threaded into tapped holes in said base member.

15. The apparatus of claim 14 further including means for aligning various members of said female die assembly prior to attaching said female die assembly to the base member, including at least one alignment pin extending through corresponding alignment holes in each of the various members of the female die assembly.

16. The apparatus of claim 15 further including at least one alignment pin pressed into a bore of the base member and extending for sliding engagement with a hollow bore of the male die assembly, said male die assembly having a bushing mounted therein for receiving said alignment pin.

17. The apparatus of claim 16 further including stop means for limiting the travel of said alignment pin of the female die assembly into the bushing and bore of the male die assembly.

18. The apparatus of claim 4 wherein said outer plate includes a central aperture about which are arrayed said third plurality of holes for establishing a clearance space surrounded by said third plurality of holes.

19. The apparatus of claim 1 wherein said movement establishing means comprise means for mounting said male and female die assemblies on corresponding relatively movable portions of a hydraulic press.

20. For use in apparatus for trimming a plurality of electronic circuit leads in unison, which apparatus includes a shearing blade for insertion into a female die assembly in which said leads are positioned for trimming, the combination comprising:

a shear plate mounted adjacent said blade when the blade is within said assembly, the shear plate defining holes for receiving said leads which extend into said blade, shock absorbing means for contacting said leads and damping the shock wave transmitted along the leads from the points where the leads are trimmed, and said shock absorbing means including a plurality of O-rings constructed of resilient material and positioned in concentric alignment adjacent the holes defined by the shear plate.

21. The combination of claim 20 further including means for positioning the O-rings adjacent the shear plate such that each circuit lead is inserted through a corresponding O-ring when the leads are positioned within the female die assembly for trimming.

22. The combination of claim 21 wherein said positioning means comprise an outer plate adjacent the shear plate remote from said blade, the outer plate defining a corresponding plurality of holes, each aligned with a corresponding hole of the shear plate, each having a counterbore next to the shear plate in which a corresponding O-ring is mounted.

23. The combination of claim 22 wherein each of the holes in the outer plate is countersunk at the surface of the outer plate remote from the shear plate.

* * * * *